United States Patent [19]
Baba

[11] Patent Number: 6,046,077
[45] Date of Patent: Apr. 4, 2000

[54] SEMICONDUCTOR DEVICE ASSEMBLY METHOD AND SEMICONDUCTOR DEVICE PRODUCED BY THE METHOD

[75] Inventor: Mikio Baba, Tokyo, Japan

[73] Assignee: NEC Corporation, Tokyo, Japan

[21] Appl. No.: 09/222,992

[22] Filed: Dec. 30, 1998

[30] Foreign Application Priority Data

Jan. 7, 1998 [JP] Japan ................................ 10-001871

[51] Int. Cl.[7] ........................... H01L 21/44; H01L 21/48; H01L 21/50
[52] U.S. Cl. ......................... 438/127; 438/108; 438/118; 438/121; 438/122; 438/124; 438/125; 438/126
[58] Field of Search ................................... 438/108, 118, 438/121, 122, 124, 125, 126, 127

[56] References Cited

U.S. PATENT DOCUMENTS 5,811,317  9/1998  Maheshwari et al. ................... 437/211
5,930,597  7/1999  Call et al. ................................. 438/106

*Primary Examiner*—John F. Niebling
*Assistant Examiner*—David A Zarneke
*Attorney, Agent, or Firm*—Young & Thompson

[57] ABSTRACT

A method of assembling a semiconductor device dissipates the stress of hardening an underfill resin injected between the wiring board and a semiconductor chip mounted on the wiring board. The underfill resin and a sealing member bonding resin are simultaneously hardened. Alternatively, a sealing space sealed by the sealing member is filled with the underfill resin.

2 Claims, 9 Drawing Sheets

SEMICONDUCTOR DEVICE ASSEMBLY METHOD AND SEMICONDUCTOR DEVICE PRODUCED BY THE METHOD

BACKGROUND OF THE INVENTION

1. Field of the Invention

The present invention relates to a semiconductor device manufacturing method and a semiconductor device, particularly to a method for assembling a semiconductor device comprising a wiring board and a semiconductor chip, mounted on the wiring board as a flip chip and thereafter secured by an underfill resin.

2. Related Art

A conventional semiconductor device in which a semiconductor chip is mounted on a printed wiring board (hereafter referred to as PWB) as a flip chip has problems in that the PWB is deformed due to the thermal expansion rate difference between the semiconductor chip made of silicon and the PWB which results in cracking of a solder joint. Therefore, the above problems have been conventionally prevented by injecting an epoxy-based underfill resin between a semiconductor chip and a PWB, and hardening the resin to reinforce the portion around a solder bump.

FIG. 1(a) is a top view showing a conventional example and FIG. 1(b) is a sectional view of the conventional example, taken along the line B-B' of FIG. 1(a). A semiconductor chip 1 is mounted on a glass-epoxy PWB 4 as a flip chip, and then covered and sealed with a sealing member constituted of a reinforcement frame 6 and a plate member 11.

That is, the semiconductor chip 1 is electrically connected to an electrode (not illustrated) on the PWB 4 through solder bumps 2 and an underfill resin 3 is injected between the semiconductor chip 1 and the PWB 4 in order to prevent the bump 2 from being damaged, and the resin is thereafter hardened through curing.

Moreover, an annular reinforcement frame 6 made of copper is previously bonded onto the PWB 4 at the outer periphery of the semiconductor chip 1 by a bonding resin 5. The annular reinforcement frame 6 has a constant separation from the semiconductor chip 1. A plate member 11 is bonded by bonding resins 10 and 9, and the semiconductor chip 1 is thereby sealed.

In the case of the above conventional packaging method, however, the PWB 4 may warp or the semiconductor chip 1 may be deformed such that a crack 17 occurs because the underfill resin 3 contracts during hardening.

The conventional packaging method is now described in detail.

FIGS. 2A to 2F are sectional views showing a conventional semiconductor-device fabrication process for the structure of FIG. 1.

First, in FIG. 2A, a plurality of pads 12 are previously arranged on one side of a rectangular PWB 4 and external electrodes 7 are arranged on the other side of the PWB 4. Moreover, though not illustrated, each of the pads 12 and the external electrodes 7 are electrically connected through a wiring layer in the PWB 4. Moreover, a reinforcement frame 6 for fixing a plate member 11 is previously bonded to the periphery of the PWB 4 by a bonding resin 5. The reinforcement frame 6 delimits a space for setting a semiconductor chip 1 between the PWB 4 and the plate member 11.

In FIG. 2B, each solder bump 2 and each pad 12 corresponding to a respective bump 2 are aligned and thereafter, the semiconductor chip 1 is mounted on the PWB 4.

In FIG. 2C, by melting the bump 2 and connecting it with the pad 12, the semiconductor chip 1 is mounted on the PWB 4. This is generally referred to as flip-chip mounting.

In FIG. 2D, to prevent the bump 2 from becoming disconnected, a flowable underfill resin 3 is injected into the gap between the semiconductor chip 1 and the PWB 4. In this case, because the gap between the semiconductor chip 1 and the PWB 4 is very small, the injected underfill resin 3 expands over the entire surface of the semiconductor chip 1 due to the capillary phenomenon.

In FIG. 2E, the injected underfill resin 3 is hardened by curing (heat-treating). Then, because the epoxy-based underfill resin 3 slightly decreases in volume due to hardening, the PWB 4 is deformed so that the central portion of it warps upward.

Thereafter, in FIG. 2F, bonding resins 10 and 9 are applied to the "back" of the semiconductor chip 1 (side opposite to the active-element forming side) and the upper side of the reinforcement frame 6 and then, the plate member 11 is mounted so as to cover the semiconductor chip 1 and the reinforcement frame 6. Then, by curing the bonding resins 10 and 9 again to harden them, the plate member 11 is fixed and a package is completed.

As shown in FIG. 3, however, these components are different from each other in thermal expansion coefficient and elastic modulus. Particularly, because the thermal expansion coefficient of the underfill resin 3 is greatly different from those of the semiconductor chip 1 and the PWB 4, the PWB 4 and the semiconductor chip 1 are warped or distorted when the underfill resin 3 is hardened. However, when a package having a distorted PWB 4 and semiconductor chip 1 is mounted on a mounting board, it is impossible to accurately connect the bump 8 serving as an external electrode to a pad on the mounting board. Therefore, there is a problem that imperfect mounting readily occurs.

Moreover, as shown in FIG. 2F, when the bonding resin 10 applied to the back of the distorted semiconductor chip 1 is hardened, there is also a problem in that a crack 17 occurs in the semiconductor chip 1 due to a stress produced under hardening.

SUMMARY OF THE INVENTION

Accordingly, it is an object of the present invention to provide a novel method of making a semiconductor device and a novel semiconductor device that avoid these problems of the related art.

Another object of the present invention is to provide a semiconductor device manufacturing method and a semiconductor device capable of preventing a package from being warped or distorted due to a stress caused by resin hardening during assembly of the package.

It is a further object of the present invention to provide a semiconductor device manufacturing method and a semiconductor device that moderate stresses produced in various portions in a package due to hardening of a resin, by offsetting stresses each other.

DESCRIPTION OF THE PREFERRED EMBODIMENTS

Now, embodiments of the present invention are described below by referring to the accompanying drawings.

Figure 1A:
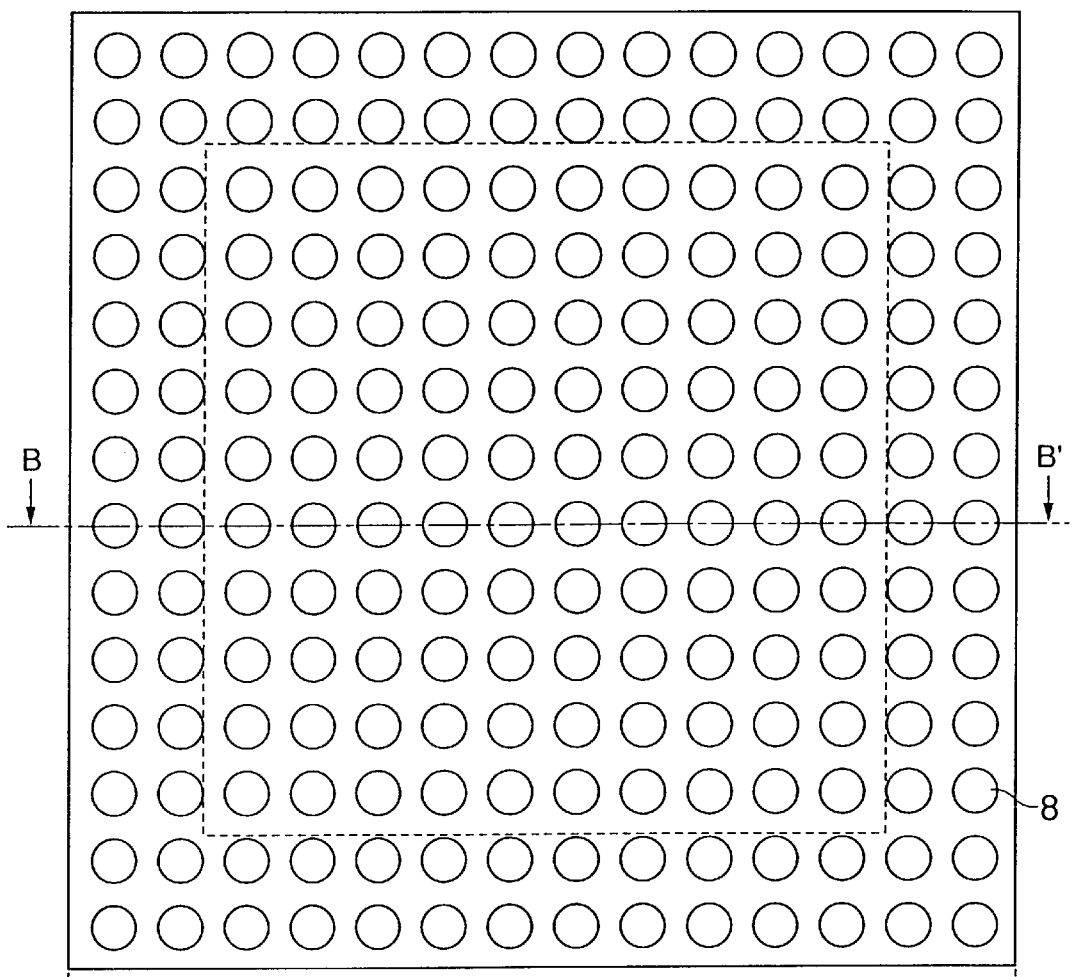
FIG. 1(a) is a top view and FIG. 1(b) is a sectional view showing a conventional example.
Figure 1B:
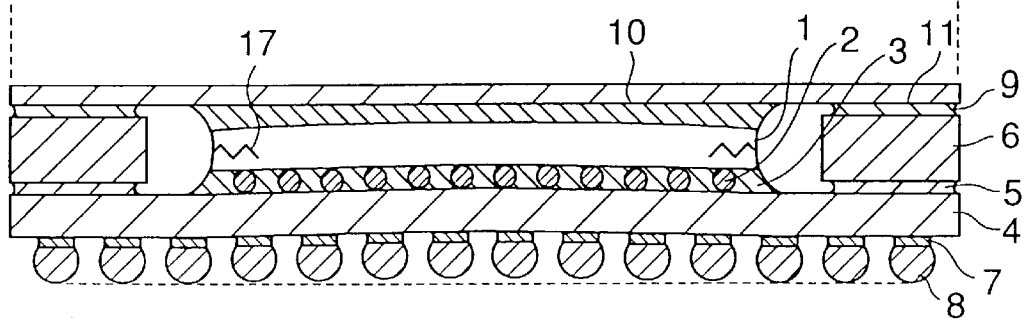
Figure 4A:
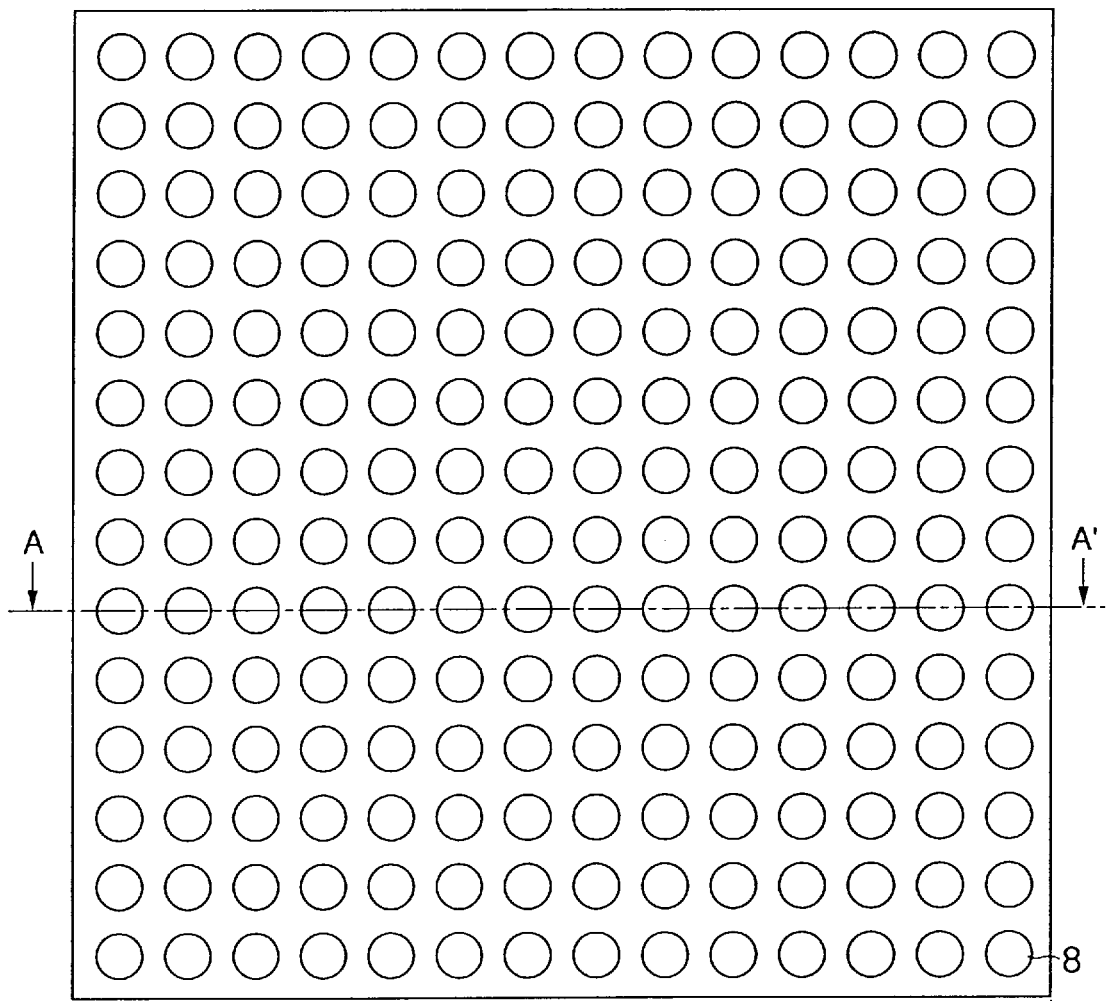
FIG. 4(a) is a top view showing a first embodiment of the present invention and 4(b) a sectional view of the first embodiment.
Figure 4B:
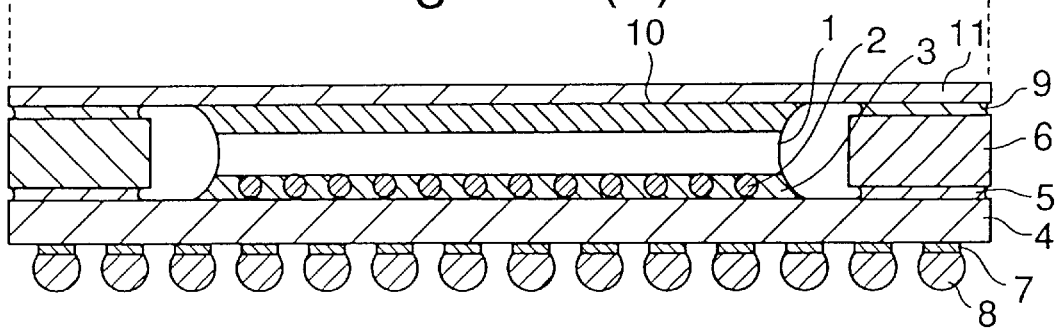

FIGS. 4(a) and 4(b) include a top view showing a first embodiment of the present invention and a sectional view of the embodiment, taken along the line A-A'. In both the drawings, components the same as or equivalent to those in FIGS. 1(a) and 1(b) are provided with the same numeral. By this first embodiment, it is possible to maintain the flatness of a semiconductor device as shown in FIG. 4(b) and moreover, prevent cracking in the semiconductor chip 1.

In the case of this embodiment, the underfill resin 3 is an epoxy-based resin (e.g. CB011R or CNB46-14 made by HISOLE) and the bonding resins 5, 9, and 10 is Ag paste comprising a silicone-based, epoxy-based, or thermoplastic resin (e.g. CT223 made by TOSHIBA CHEMICAL Co., Ltd., and 571 film made by STAYSTIK).

Moreover, the PWB 4 and the copper plate member 11 are conventional products that are commercially available. For example PWB 4 may be a glass-epoxy PWB.

Furthermore, the gap between the semiconductor chip 1 and the PWB 4 is 50 to 120 $\mu$m, the pitch between the bumps 2 is 240 $\mu$m to 1 mm, and the number of bumps 2 is up to 3,000, with 1,300 to 2,000 bumps 2 being typically used. Furthermore, the size of the semiconductor chip 1 is assumed as 13 to 17 mm$^2$. However, the number of and the reduction scale size of semiconductor chips drawn in FIG. 4 are different from those of actual semiconductor chips for clarity of the description and the same is true for the subsequent drawings.

The manufacturing method for this embodiment is now described below in detail.

Figure 2A:
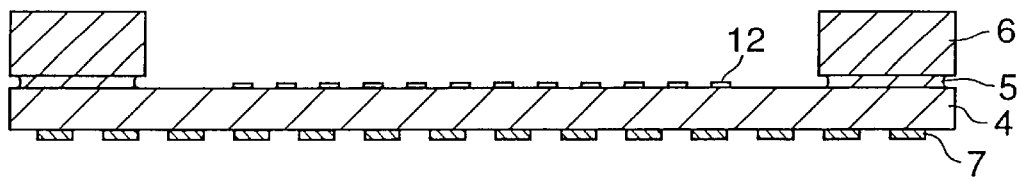
FIGS. 2A to 2F are sectional views showing fabrication steps of the semiconductor device in FIGS. 1(a) and 1(b).
Figure 2B:
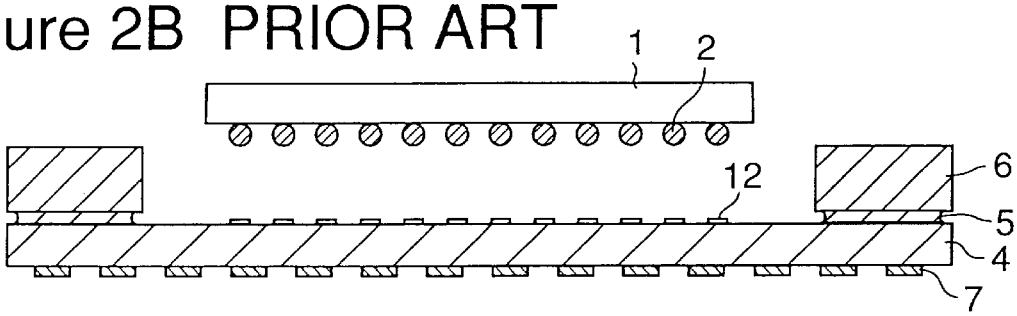
Figure 2C:
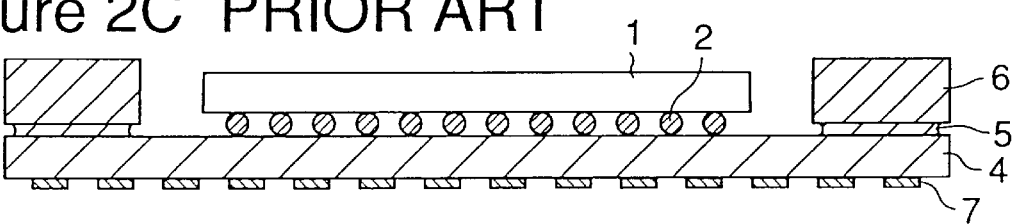
Figure 5A:
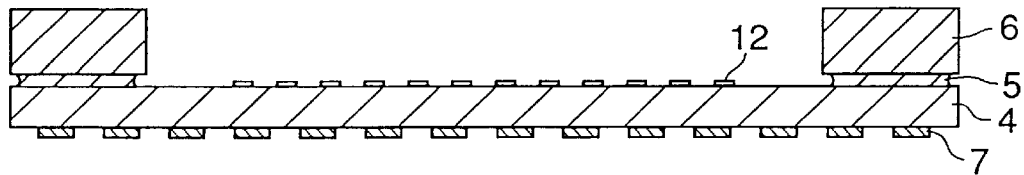
FIGS. 5A to 5E are sectional views showing fabrication steps of the semiconductor device in FIG. 4.
Figure 5B:
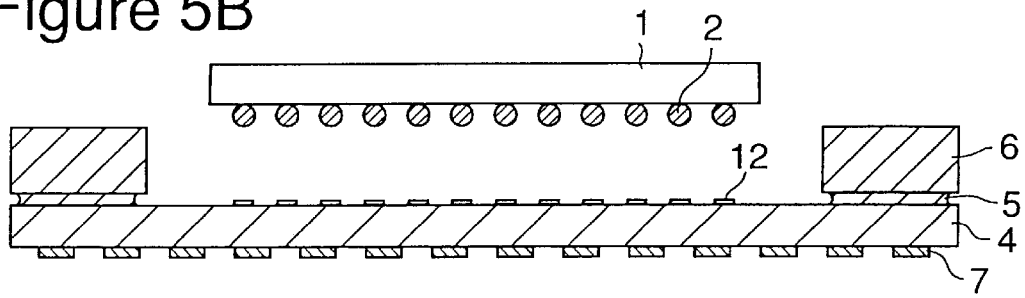
Figure 5C:
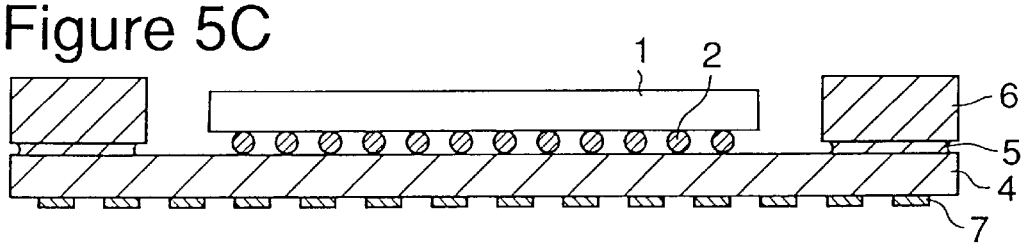
Figure 5D:
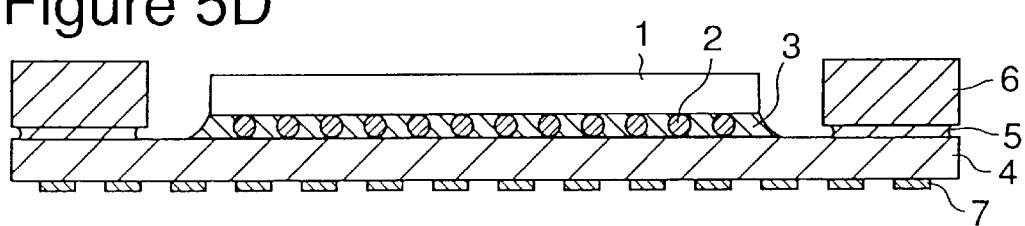
Figure 5E:
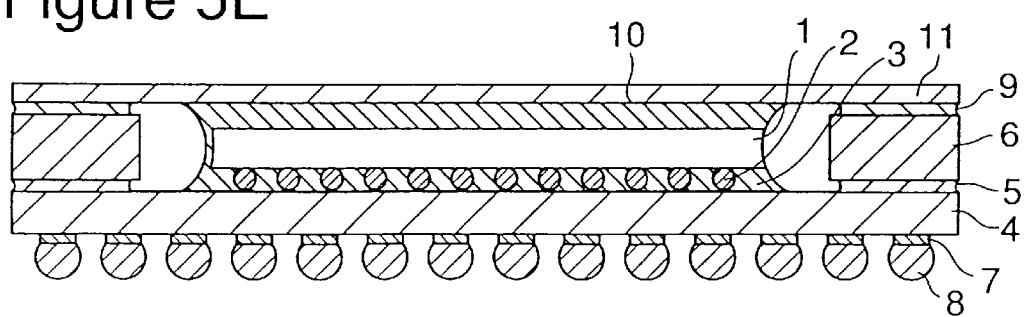

In FIGS. 5A to 5E, components the same or equivalent to those in FIGS. 4(a) and 4(b) are provided with the same symbol, and description of the steps in FIGS. 5A to 5C is omitted because those steps are almost the same as those in FIGS. 2A to 2C; however, the steps in FIGS. 5D and 5E are described below in detail.

Figure 2D:
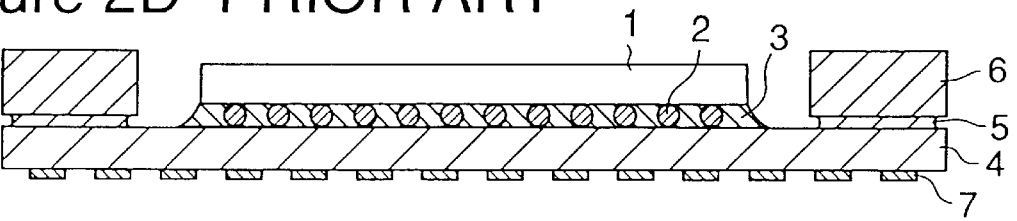
Figure 2E:
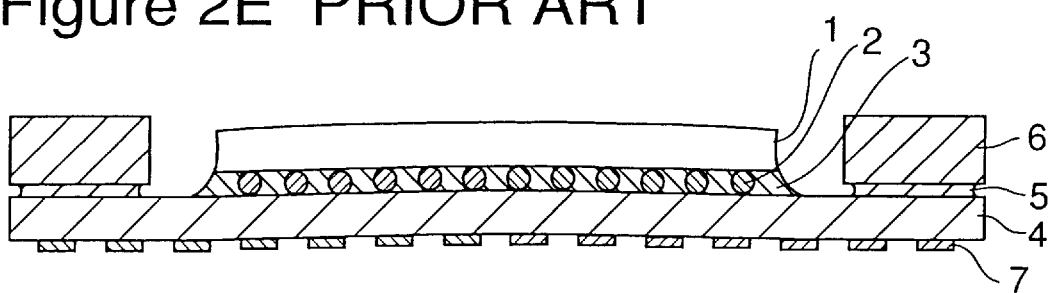
Figure 2F:
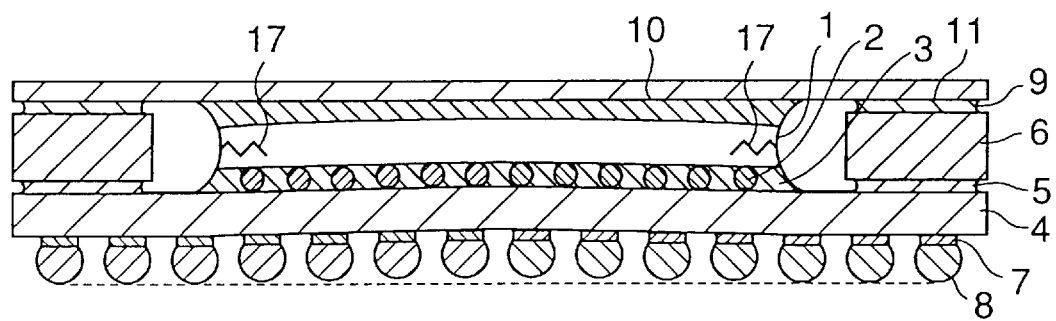
Figure 3:
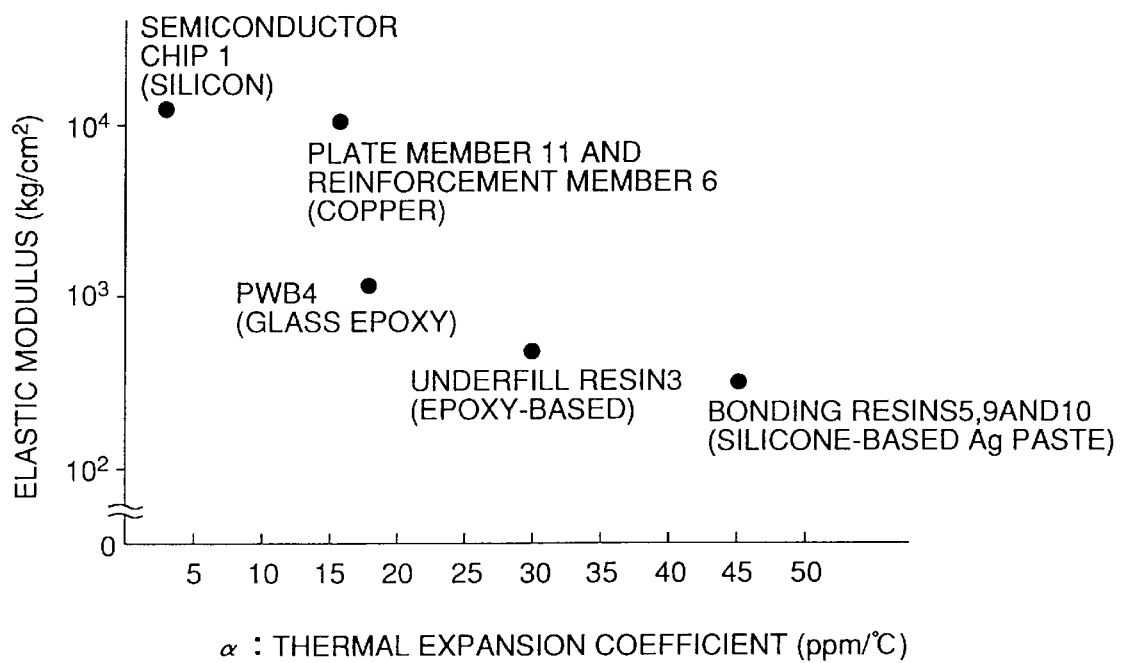
FIG. 3 is a graph showing the relation between thermal expansion coefficient and elastic modulus.

The step in FIG. 5D appears to be generally the same as that in FIG. 2D. However, in the step in FIG. 5D, the epoxy-based underfill resin 3 is only injected but curing is not yet performed.

In FIG. 5E, the silicone-based bonding resins 10 and 9 made of Ag paste having a low elastic modulus are applied to the back of the semiconductor chip 1 (side of the semiconductor chip 1 opposite to the active-element forming side of the chip 1) mounted on the PWB 4 in the preceding step, and the upper side of the reinforcement frame 6. Then, the plate member 11 is mounted, and only thereafter, the entire package is cured to simultaneously harden the underfill resin 3 and the bonding resins 10 and 9. The cure is performed at sufficient temperature and for a sufficient time to harden the underfill resin 3 and the bonding resins 10 and 9. As a result, resins applied to various portions produce stresses. However, by simultaneously hardening the resins, the stresses produced at the same time offset each other and therefore, no stress is locally applied to the PWB 4 or semiconductor chip 1. Therefore, the PWB 4 or semiconductor chip 1 is not warped or distorted, in contrast to the case of the conventional example.

Other embodiments of the present invention are now described below by referring to the accompanying drawings.

FIGS. 6 to 9 are sectional views showing other embodiments of the present invention, in which a component same as or equivalent to that in FIG. 4 is provided with the same symbol.

Figure 6:
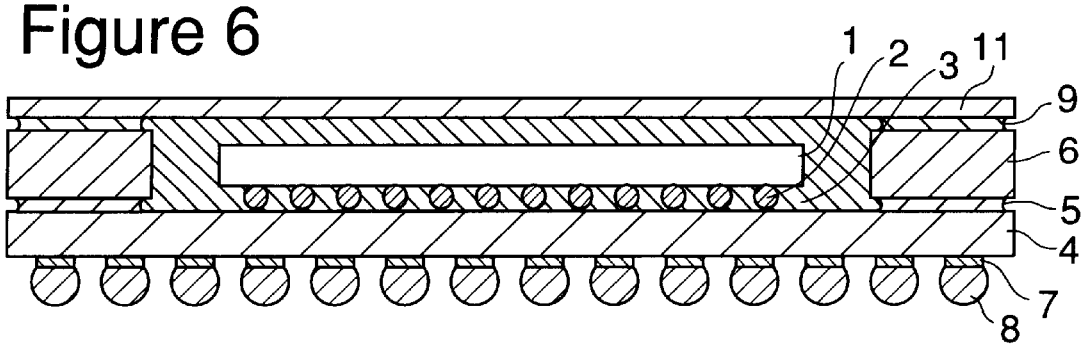
FIG. 6 is a sectional view showing the second embodiment of the present invention.

In FIG. 6, the second embodiment is constituted by injecting the underfill resin 3 of the first embodiment not only into the lower side of the semiconductor chip 1 but also so as to completely fill the gaps around the semiconductor chip 1. By completely filling the periphery of the semiconductor chip 1 with an underfill resin similarly to the case of the first embodiment, a stress produced due to the resin effect is not locally applied to the semiconductor chip 1.

Figure 7:
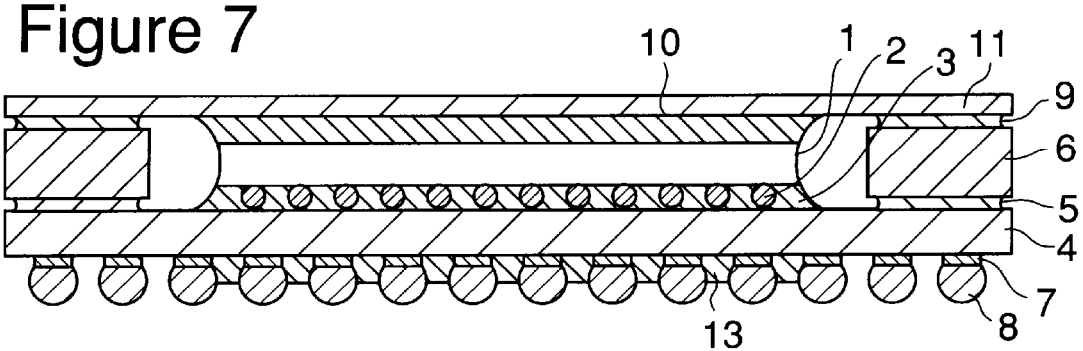
FIG. 7 is a sectional view showing the third embodiment of the present invention.

In FIG. 7, the third embodiment is constituted by applying the reinforcement resin 13 to the first embodiment so that the bumps 8 are reinforced on the front side.

To prevent the PWB 4 from being deformed, it is preferable to use a material having a thermal expansion coefficient equal to or greater than that of the underfill resin 3 as the reinforcement resin 13.

Figure 8:
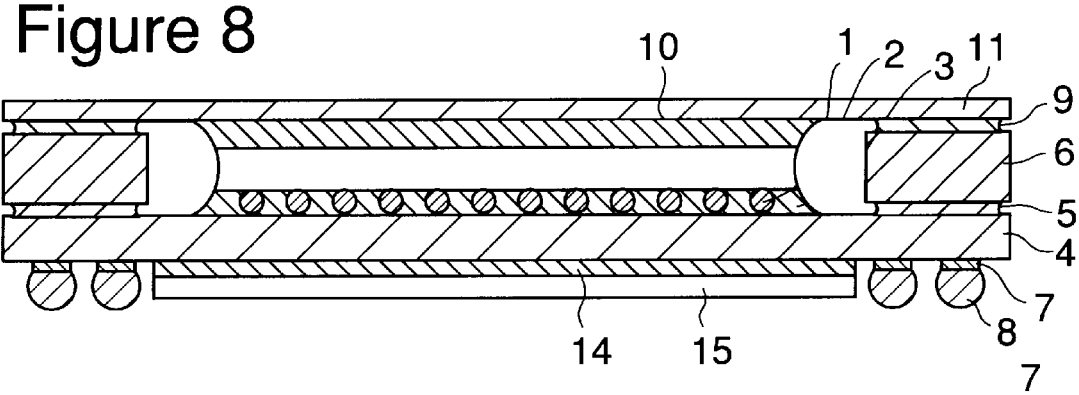
FIG. 8 is a sectional view showing the fourth embodiment of the present invention.

In FIG. 8, the fourth embodiment is applied to a package in which the bumps 8 are formed only at the periphery of the PWB 4 and constituted by bonding a flat reinforcement member 15 to the central portion of the PWB 4 by a bonding resin 14.

To prevent the PWB 4 from being deformed, it is preferable to use a material having a thermal expansion coefficient equal to or less than that of silicon as the reinforcement member 15. Moreover, the diameter of the bump 8 is set to 0.6 mm and 800 bumps 8 are used. Because the thickness of the reinforcement plate 15 must be smaller than the diameter of the bump 8, the thickness is set to 0.5 mm or less.

Figure 9:
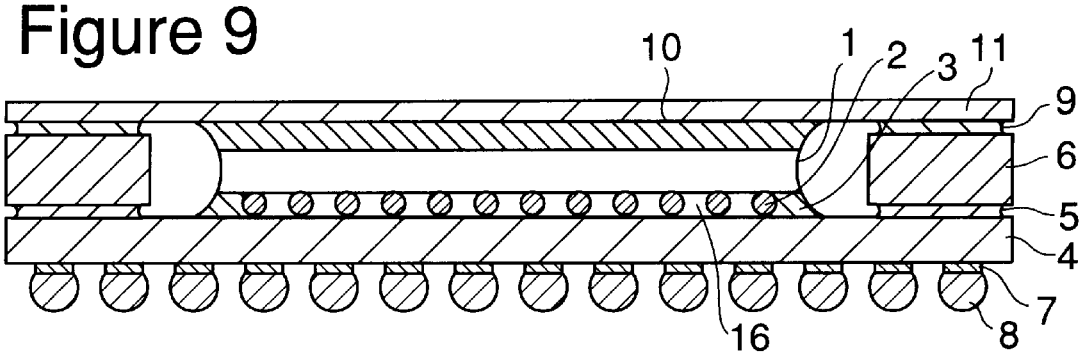
FIG. 9 is a sectional view showing the fifth embodiment of the present invention.

In FIG. 9, the fifth embodiment is constituted by applying the underfill resin 3 to only the peripheral portion of the semiconductor chip 1, and thereby decreasing the stress due to the underfill resin 3. Therefore, a hollow portion 16 is formed in the central portion of the semiconductor chip 1 interrupted by the bumps 2. If the underfill resin 3 is injected from one of the four sides of rectangular semiconductor chip 1, the air existing between the semiconductor chip 1 and the PWB 4 is pushed out from the opposite side to the injected side. But in this embodiment, the underfill resin 3 is simultaneously injected from all four sides of rectangular semiconductor chip 1. The underfill resin 3 is thereby applied to only the peripheral portion of the semiconductor chip 1, because the air of the hollow portion 16 has no escape path.

Advantages of the first to fifth embodiments are verified by measuring the warpage of a package.

Figure 12:
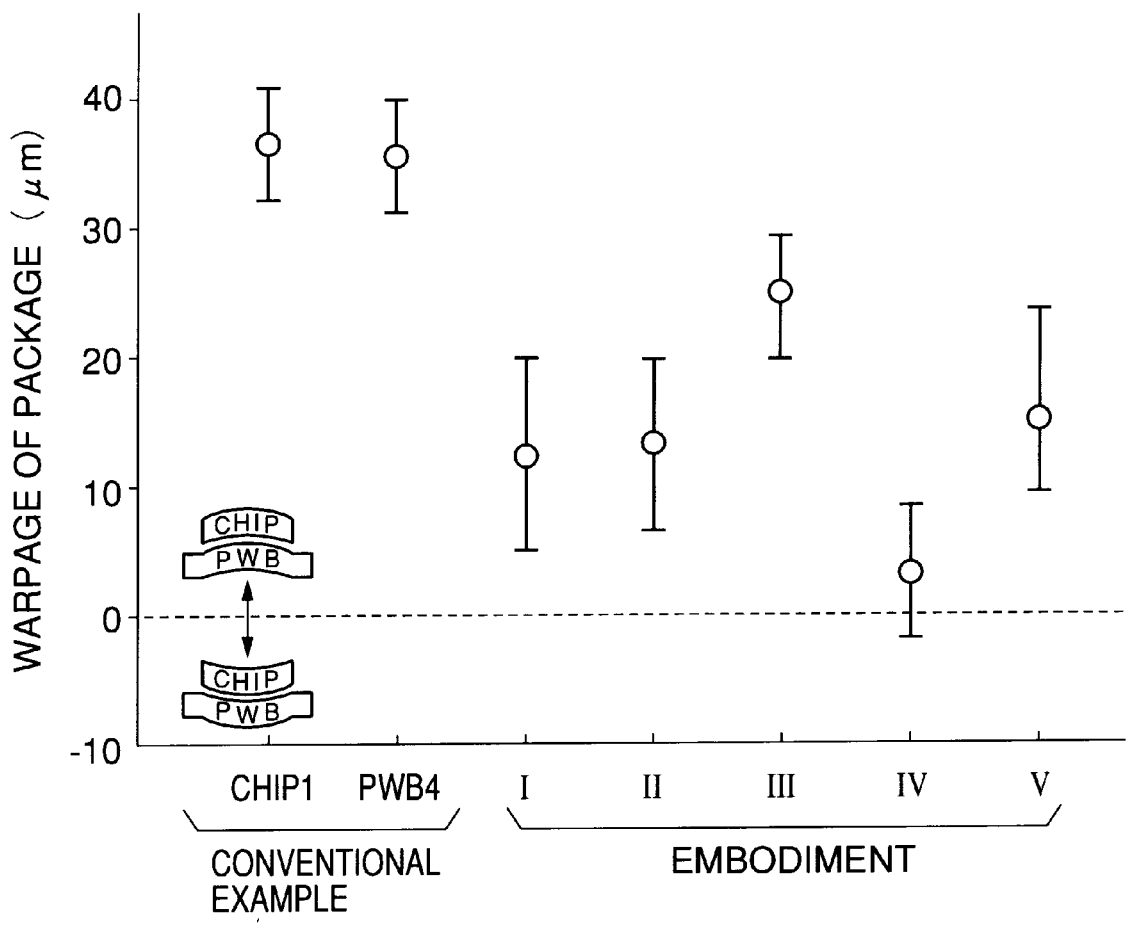
FIG. 12 is a graph concerned with warpages.

FIG. 12 is a graph showing warpages of packages (chip size of 15 mm$^2$) of the conventional examples and the first to fifth embodiments. As shown in FIG. 12, a warpage of 30

μm or more occurs in the case of the conventional examples. However, in the case of the first to fifth embodiments, it is possible to control the extent of warpage to less than 30 μm in every case. Thus, it is found that warpages are very effectively controlled compared to the case of the conventional examples.

Figure 10:
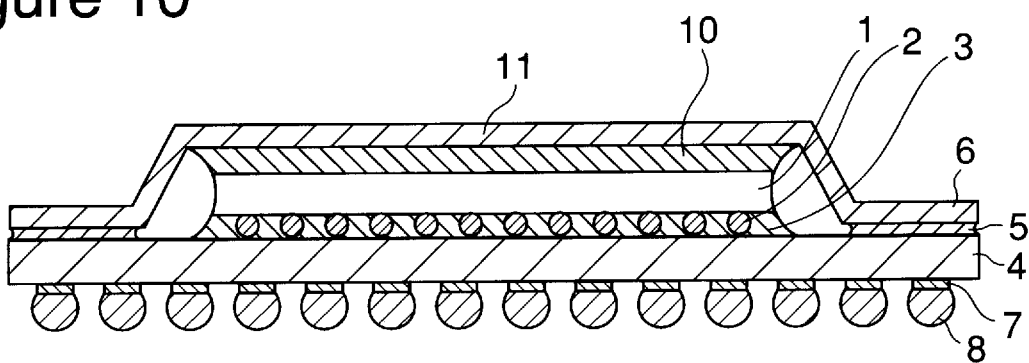
FIG. 10 is a sectional view showing the sixth embodiment of the present invention.
Figure 11:
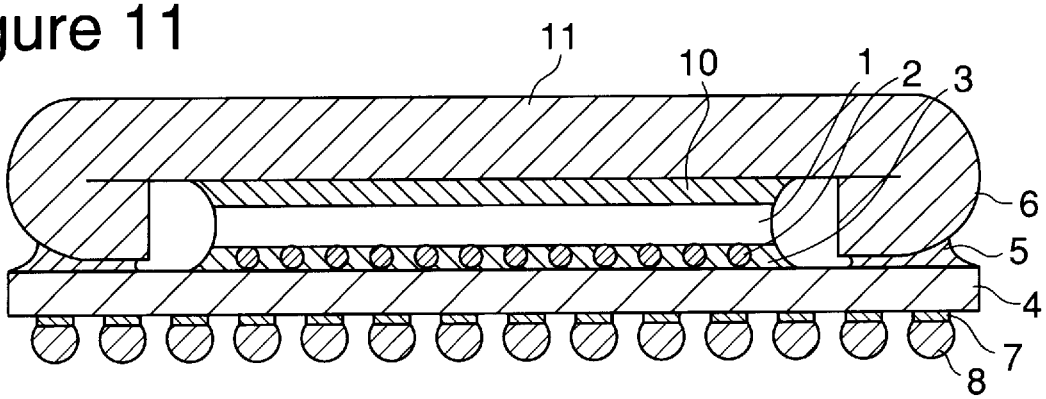
FIG. 11 is a sectional view showing the seventh embodiment of the present invention.

In the case of the above embodiments, a sealing member is constituted with the reinforcement frame 6 and the plate member 11. However, it is also possible to use the member shown in FIGS. 10 and 11. That is, the plate member 11 having an area larger than that of the semiconductor chip 1 is formed by bending the margin of the member 11 so as to also form the reinforcement frame 6.

Though various methods for bending the margin are possible, the sixth and seventh embodiments have an advantage in that they can be inexpensively fabricated because the structures are simple and the number of parts decreases.

As described above, in the present invention, a stress produced due to hardening of a resin is not locally applied to a wiring board or a semiconductor chip because of simultaneously hardening resins in various portions in a package. As a result, the wiring board or semiconductor chip is not deformed and moreover, an electrode is not damaged or a crack does not occur in the semiconductor chip.

Therefore, by using the present invention, it is possible to easily obtain a semiconductor package superior in flatness, and imperfect mounting very rarely occurs when mounting the package on a mounting board.

While preferred embodiments of the present invention have been described, it is to be understood that the invention is to be defined by the appended claims when read in light of the specification and when accorded their full range of equivalents.

What is claimed is:

1. A method of manufacturing a semiconductor device comprising the steps of:

mounting a reinforcement frame on a wiring board;

mounting a semiconductor chip on one side of said wiring board through a plurality of bumps connecting said semiconductor chip and said wiring board;

injecting an underfill resin between said wiring board and said one side of said semiconductor chip, and also injecting said underfill resin on all other sides of said semiconductor chip and on said reinforcement frame to constitute a sealing member bonding resin;

mounting a sealing member on said wiring board and contacting said sealing member bonding resin; and hardening said underfill resin and said sealing member bonding resin simultaneously.

2. The method of claim 1, wherein injecting said underfill resin is performed so as to completely fill, a gap region intermediate a periphery of said semiconductor chip and said reinforcement frame.

* * * * *